United States Patent
Schulze et al.

(10) Patent No.: US 8,222,681 B2
(45) Date of Patent: Jul. 17, 2012

(54) BIPOLAR SEMICONDUCTOR DEVICE AND MANUFACTURING METHOD

(75) Inventors: Hans-Joachim Schulze, Taufkirchen (DE); Francisco Javier Santos Rodriguez, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/332,426

(22) Filed: Dec. 21, 2011

(65) Prior Publication Data

US 2012/0098030 A1 Apr. 26, 2012

Related U.S. Application Data

(62) Division of application No. 12/608,737, filed on Oct. 29, 2009, now Pat. No. 8,120,074.

(51) Int. Cl.
*H01L 29/745* (2006.01)
(52) U.S. Cl. ........ 257/288; 257/262; 257/139; 257/401; 257/287; 257/901; 257/368; 257/408; 257/E29.027; 257/E29.028; 257/E29.202; 257/E29.255; 257/E29.313; 257/E29.315
(58) Field of Classification Search .......... 257/288, 257/262, 139, 401, 287, 901, 368, 408, E29.027, 257/E29.028, E29.202, E29.255, E29.313, 257/E29.315
See application file for complete search history.

(56) References Cited

U.S. PATENT DOCUMENTS

| | | | |
|---|---|---|---|
| 4,618,872 A * | 10/1986 | Baliga | 257/140 |
| 5,998,811 A * | 12/1999 | Huang | 257/153 |
| 7,300,854 B2 | 11/2007 | Benzel et al. | |
| 7,737,491 B2 | 6/2010 | Hotta et al. | |
| 2002/0170875 A1 | 11/2002 | Benzel et al. | |
| 2007/0087509 A1 | 4/2007 | Maeda et al. | |

FOREIGN PATENT DOCUMENTS

| | | |
|---|---|---|
| DE | 19651108 | 10/1997 |
| DE | 10032579 | 1/2002 |
| DE | 102006007729 | 8/2007 |
| JP | 2005-210047 | 8/2005 |

OTHER PUBLICATIONS

Office Action mailed Apr. 13, 2011 in U.S. Appl. No. 12/608,737.
Bosch Research Information, "Revolution under the Hood", Jan. 2003, pp. 1-4.
Dr. Simon Armbruster, "Porous Silicon for MEMS Sensors and Beyond", 2008, pp. 1-25.

* cited by examiner

*Primary Examiner* — Marc Armand
(74) *Attorney, Agent, or Firm* — Dicke, Billig & Czaja, PLLC

(57) ABSTRACT

A trench IGBT is disclosed. One embodiment includes an embedded structure arranged above a collector region and selected from a group consisting of a porous semiconductor region, a cavity, and a semiconductor region including additional scattering centers for holes, the embedded structure being arranged below the body contact region such that the embedded structure and the body contact region overlap in a horizontal projection.

4 Claims, 17 Drawing Sheets

BIPOLAR SEMICONDUCTOR DEVICE AND MANUFACTURING METHOD

CROSS-REFERENCE TO RELATED APPLICATIONS

This Utility patent application is a divisional application of U.S. application Ser. No. 12/608,737, filed Oct. 29, 2009, which is incorporated herein by reference.

BACKGROUND

This specification refers to bipolar semiconductor devices, in one or more embodiments to IGBTs and a manufacturing method therefor.

Field-effect controlled switching devices such as Metal Oxide Semiconductor Field Effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on IGBT, i.e., the collector-emitter saturation voltage VCEsat, is desired to be low. On the other hand, the losses occurring during switching off or commutating of the IGBT are often also to be kept small to minimize the overall losses. A low VCEsat may be achieved by a high hole plasma concentration in the on-state which in turn tends to increase the switching losses. The trade-off between turn-off performance and VCEsat is, therefore, often unsatisfactory for known IGBTs.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
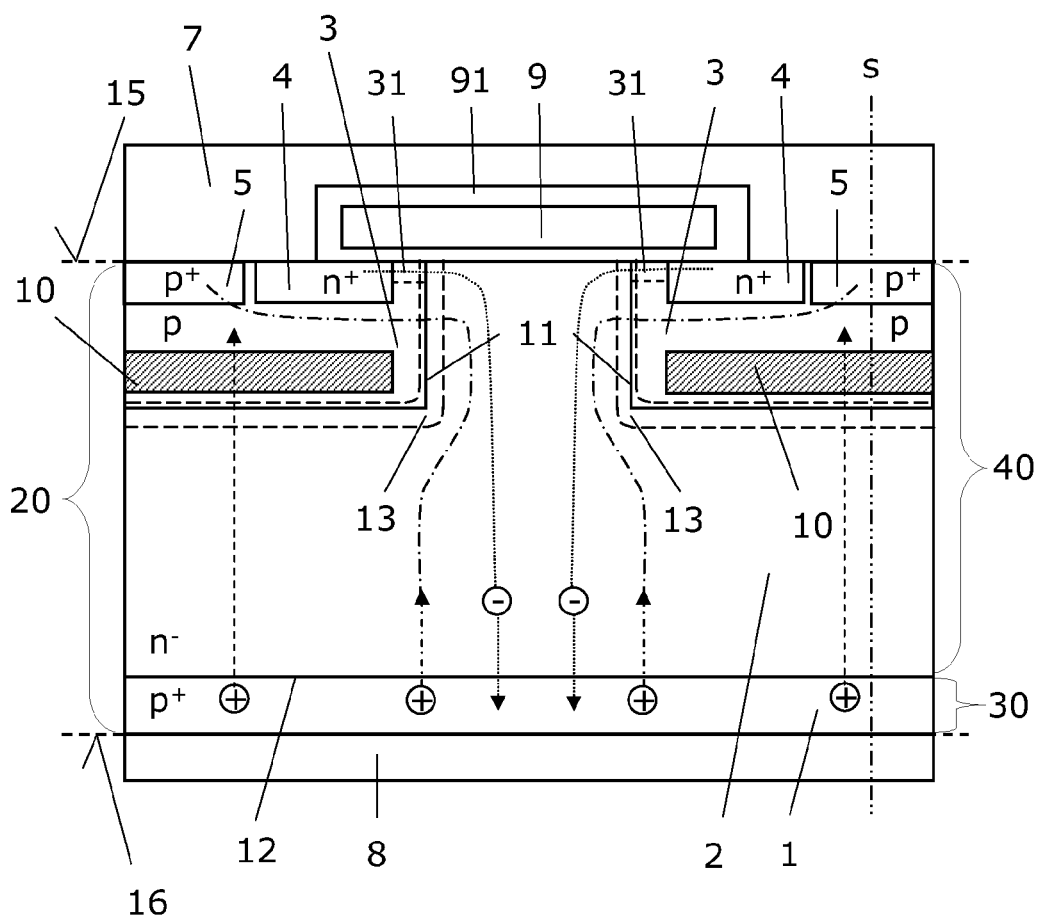
FIG. 1 illustrates a vertical cross-section of a semiconductor device according to one embodiment.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims.

The term "horizontal" as used in this specification intend to describe an orientation parallel to a first surface of a semiconductor substrate or body. This can be for instance the surface of a wafer or a die.

The term "vertical" as used in this specification intends to describe an orientation which is arranged perpendicular to, i.e., in normal direction of, the first surface of the semiconductor substrate or body.

Some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. Indicating the relative doping concentration does not, however, mean that doping regions of the same relative doping concentration have to have the same absolute doping concentration unless otherwise stated. For example, two different $n^+$ regions can have different absolute doping concentrations. The same applies, for example, to an $n^+$ and a $p^+$ region.

Specific example embodiments described in this specification pertain to, without being limited thereto, bipolar semiconductor devices which are controlled by field-effect such as IGBTs and particularly to power IGBTs.

The term "field-effect" as used in this specification intends to describe the electric field mediated formation of an "inversion channel" and/or control of conductivity and/or shape of the inversion channel in a semiconductor region. The conductivity type of the channel region is typically changed, i.e., inverted, for forming a unipolar current path between two semiconductor regions of the inverted conductivity type which are adjacent to the channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

In the context of the present specification, a semiconductor region in which an inversion channel can be formed and/or controlled by the field effect is also referred to as body region.

In the context of the present specification, the term "field-effect structure" intends to describe a structure which is formed in a semiconductor substrate or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$).

Above a threshold voltage Vth between the gate electrode and the body region, an inversion channel is formed and/or controlled due to the field-effect in a channel region of the body region adjoining the dielectric region or dielectric layer. The threshold voltage Vth typically refers to the minimum gate voltage necessary for the onset of a unipolar current flow between the two semiconductor regions of the first conductivity type, which form the source and the drain of a transistor structure.

According to one embodiment, an n-channel IGBT is provided. The IGBT includes a p-doped body region having a first hole mobility and a sub region which is completely embedded within the body region and has a second hole mobility which is lower than the first hole mobility.

According to another embodiment, a method for forming a bipolar semiconductor device is provided. A semiconductor substrate with a main horizontal surface, an n-type first semiconductor region, a p-type second semiconductor region and a pn-junction is provided. A p-type third semiconductor region having a third doping concentration is formed such that the first semiconductor region and the third semiconductor region form a further pn-junction above the pn-junction. An embedded structure having a hole mobility which is lower than hole mobility of adjoining semiconductor regions is formed above the pn-junction. A p-type fourth semiconductor region having a fourth doping concentration which is higher than the third doping concentration is formed in electrical contact with the p-type third semiconductor region such that the fourth semiconductor region and the embedded structure are arranged in two vertical cross-sections which are orthogonal to each other and to the main surface.

Further embodiments, modifications and improvements of the semiconductor device and methods for forming the semiconductor devices will become more apparent from the following description and the appending claims.

FIG. 1 illustrates, in a vertical cross-section, one embodiment of a semiconductor device 100 which is typically a power semiconductor device in this embodiment. The semiconductor substrate 20 can be a single bulk mono-crystalline material. It is also possible, that the semiconductor substrate 20 includes a bulk mono-crystalline material 30 and at least one epitaxial layer 40 formed thereon. Using epitaxial layers provides more freedom in tailoring the background doping of the material since the doping concentration can be adjusted during deposition of the epitaxial layer or layers.

For sake of clarity, the semiconductor substrate 20 is, in the following examples, considered to be made of silicon. The semiconductor substrate 20 can, however, be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaP) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide ($Si_xC_{1-x}$) and SiGe heterojunction semiconductor material. For power semiconductor applications currently mainly Si, SiC and GaN materials are used.

Typically, the semiconductor substrate 20 or semiconductor body 20 is formed by providing a single bulk mono-crystalline p-type body 30 on which one or more single-crystalline layers 40 are deposited epitaxially. The body 30 may form a highly doped p-type collector region 1. The epitaxial layer or layers 40 accommodates or accommodate, in the illustrated vertical cross-section, an n-type drift region 2, and two spaced apart p-type body regions 3. The drift region 2 forms with each of the body regions 3 respective first pn-junctions 11 and with the collector region 1 a second pn-junction 12. In the following embodiments, the second pn-junction 12 and the first pn-junction 11 are also referred to as pn-junction and further pn-junction, respectively. The term "junction" as used in this specification intends to describe the boundary surface or boundary layer between adjoining semiconductor regions or portions of the same conductivity type but having significantly different doping concentrations. Different thereto, the terms "pn-junction" and "rectifying junction" describe the interface between adjoining semiconductor regions of opposite doping type.

In some embodiments, the drift region 2 extends from the second pn-junction 12 to a first or main horizontal surface 15 of the semiconductor substrate 20. The semiconductor device 100 of FIG. 1 further includes a first metallization or first electrode 7 which forms an emitter electrode or emitter 7 in one embodiment and is arranged on the first surface 15, and in Ohmic contact with the body regions 3 via respective highly doped p-type body contact region 5 of the semiconductor substrate 20. In the context of the present specification, the terms "in Ohmic contact", "in electric contact", "in contact" and "electrically connected" intend to describe that there is an Ohmic electric connection or Ohmic current path between two regions, portions or parts of a semiconductor devices, in particular a connection of low Ohmic resistance, even if no voltages are applied to the semiconductor device. An Ohmic electric connection is characterized by a linear and symmetric current-voltage (I-V) curve different to, for example, the asymmetric current-voltage (I-V) curve of a pn-junction.

The semiconductor substrate 20 further includes, in the illustrated vertical cross-section, two highly doped n-type regions 4 in Ohmic contact with the first metallization 7. Each of the two n-type regions 4 adjoin a respective body region 3 and form in one embodiment a source region 4.

The semiconductor device 100 further includes an insulated gate electrode 9 which is in an embodiment also arranged on the first surface 15. The gate electrode 9 is arranged next to the drift region 2, the body regions 3, i.e., next to the first pn-junctions 11, and next to the source regions 4 for forming a n-channel region 31 or n-channel 31 along the gate insulating region 91 between each of the source regions 4 and the drift region 3 in the respective p-type body regions 3. In a forward mode of the semiconductor device 100, the n-channel provides a unipolar current path between the first metallization 7 or emitter electrode 7 and the drift region 3. The collector region 1 typically extends downwards from the second pn-junction 12 to a second horizontal surface 16 of the semiconductor substrate 20. As the second surface 16 is opposite to the first surface 15, the second surface 16 is in the following also referred to as opposite surface 16. Furthermore, the collector region 1 forms an Ohmic contact to a second metallization 8 or second electrode 8 which forms a collector electrode 8 or collector 8 in this embodiment and is arranged on the second surface 16.

As indicated by the dotted arrows, an electron current can flow, in a forward-conducting-mode of the semiconductor device 100, from the emitter electrode 7 via the source regions 4, the adjoining respective n-channels 31, the drift region 2 and the collector region 1 to the collector electrode 8. In a forward mode the collector voltage is higher than the emitter voltage, i.e., the second pn-junction 12 is forwardly biased. In forward mode and at high enough gate voltage the inversion channels 31 are formed and the semiconductor device 100 is in the on-state or forward conducting mode, otherwise in blocking mode in which the current flow is blocked. When the second pn-junction 12 is reversely biased, the current flow is also blocked. In other words, the bipolar semiconductor device 100 may be operated as an IGBT. Accordingly, the resistance of the n⁻ drift region 2 and hence VCEsat are considerably reduced in forward-conducting-mode due to the injection of holes (minority carriers in the drift region 2) from the p⁺ collector region 1 into the drift region 2.

According to one embodiment, the semiconductor substrate 20 further includes in each of the body regions 3 a hole current redistributing structure 10 or hole current redistributing structure 10. This means that the hole current redistributing structure 10 is completely embedded in the semiconductor substrate 10 and arranged between the emitter electrode 7 and the first pn-junction 11. In order to redistribute the hole current in the forward conducting mode, the hole mobility of the hole current redistributing structure 10 is at least reduced compared to the hole mobility of the adjoining or embedding semiconductor regions, i.e., the body regions 3 in the embodiment of FIG. 1.

In other words, the semiconductor device of FIG. 1 may be described as an re-channel IGBT with a p-doped body region having a completely embedded sub region with reduced hole mobility.

Typically, the hole mobility of the hole current redistributing structure 10 is lower than about a half, or lower than about a fifth or even less than a tenth of the hole mobility of the body regions 3. The hole mobility of the current redistributing structure 10 may be much smaller than the hole mobility of the body regions 3. The current redistributing structure 10 may even have zero mobility for holes. The current redistributing structure 10 may for example be a cavity and/or include an insulating material. Due to the reduced hole mobility and the arrangement of the hole current redistributing structure 10, the hole current along the geometrically shortest lines between the collector electrode 8 and the emitter electrode 7 is typically blocked or at least reduced as indicated by the dashed arrows in FIG. 1.

In other words, the resistance of the geometrically shortest hole current paths in forward conducting mode between the body contact region 5 and the collector region 1 is increased. In doing so, the hole current in the drift region 2 close to the body regions 3 is concentrated to regions of high electron current in forward conducting mode. This is indicated by the dashed-dotted arrows in FIG. 1. In doing so, the concentration of holes or hole plasma concentration in a upper portion of the drift region 2, for example between the two illustrated first pn-junctions 11, is increased in forward conduction above the level of the remaining lower portion or backside portion of the drift region 2. Typically, on condition of a reduced doping concentration of the p-emitter 1, VCEsat is not or almost not increased compared to an IGBT 100 which is similar to the IGBT 100 illustrated in FIG. 1, but without the hole current redistributing structures 10.

Due to the reduced hole concentration in the lower portion, the switching losses of the semiconductor device 100 in FIG. 1 are reduced compared to an IGBT without the hole current redistributing structures 10. Likewise, on condition of an unchanged doping concentration of the p-emitter 1, VCEsat can be reduced for a given switching loss of an IGBT by integrating the hole current redistributing structures 10. In other words, the hole current redistributing structures 10 result in a redistribution of the hole plasma concentration of the on-state such that the trade-off between turn-off performance and VCEsat is improved.

According to one embodiment, the hole current redistributing structures 10 are formed by respective p-doped sub regions 10 which include additional scattering centers for holes. Such additional hole scattering centers decrease the mobility of holes $\mu_n$ and may be obtained by additionally doping the p-doped sub regions with a donor such as phosphorous, selenium or arsenic in a concentration that is lower than the concentration of the p-doping of the sub regions 10. In other words, the p-doping of the sub regions 10 is only partially compensated, in an embodiment, by additional donors to incorporate additional hole scattering centers in the p-doped sub region 10. In doing so, no further pn-junction is formed and the mobility of holes $\mu_n$ may be reduced without changing the carrier lifetime of holes. It is however also possible, to dope the p-doped sub region 10 with impurities that neither act as donor nor as acceptor, and act as additional hole scattering centers, such as e.g. germanium or carbon in a silicon semiconductor material. For impurities which do not act as donors, the doping concentration is typically higher than for dopants used for partially compensating the p-doping of the sub region 10.

The hole scattering centers may also be obtained by implanting of ions such as Si-, H-, He-, Ar-, or B-ions into sub regions 10 of the body region 3 and subsequent annealing to form crystal defects in the sub regions 10 which may operate as hole current redistributing structures 10 in this embodiment.

In one embodiment, the hole current redistributing structures 10 are formed by sub regions 10 made of a porous semiconductor material, e.g. of porous silicon. Depending on porosity, the mobility of holes $\mu_n$ (as well as the electron mobility) can be significantly reduced. Porosity typically ranges from about a few 5 to about 100% (larger cavity). The sub regions 10 may also be heterogeneous, e.g. be composed of an upper portion with a porosity which is e.g. smaller than about 50% and of a lower portion with a larger porosity, e.g. up to 70%. Porous silicon sub regions 10 may e.g. be produced by masked anodic electrochemical oxidation (anodizing) and etching and annealing which is typically followed by depositing an epitaxial layer.

According to one embodiment, the hole current redistributing structures 10 may include or may be made of at least one of a porous semiconductor region, a cavity, an insulating region, and a semiconductor region with additional scattering centers for holes. It goes without saying that the hole current redistributing structures 10 may be composed of different portions.

In order to redistribute the hole plasma of the on-state such that the trade-off between turn-off performance and VCEsat is improved, the hole current redistributing structures 10 are typically arranged below the respective body contact region 5, i.e., the current redistributing structures 10 and the respective body contact region 5 overlap in a projection on a horizontal plane or in a plane view.

Further, the hole current redistributing structures 10 typically do not overlap with the channel regions 31, or have a small overlap only in a projection on a horizontal plane or in plane view to avoid or minimize reducing the hole mobility in or close to the channel regions 31.

In one embodiment, the hole current redistributing structures 10 are arranged in a portion of the respective body region 3 that is not depleted during reversed bias of the first pn-junctions 11. In the blocking state, the drift region 2 is, depending on voltage between emitter electrode 7 and collector electrode 8, depleted from the first pn-junction 11 to the dashed lines in the drift region 2 drawn in FIG. 1. The body regions 3 are also depleted in the blocking state as indicated by the dashed lines in the body regions 3, but typically to a lesser extend than the drift region 2 due the higher doping concentration of the body regions 3. To avoid high field strength close to the hole current redistributing structures 10, the hole current redistributing structures 10 are typically arranged outside the depleted regions 13.

Figure 2:
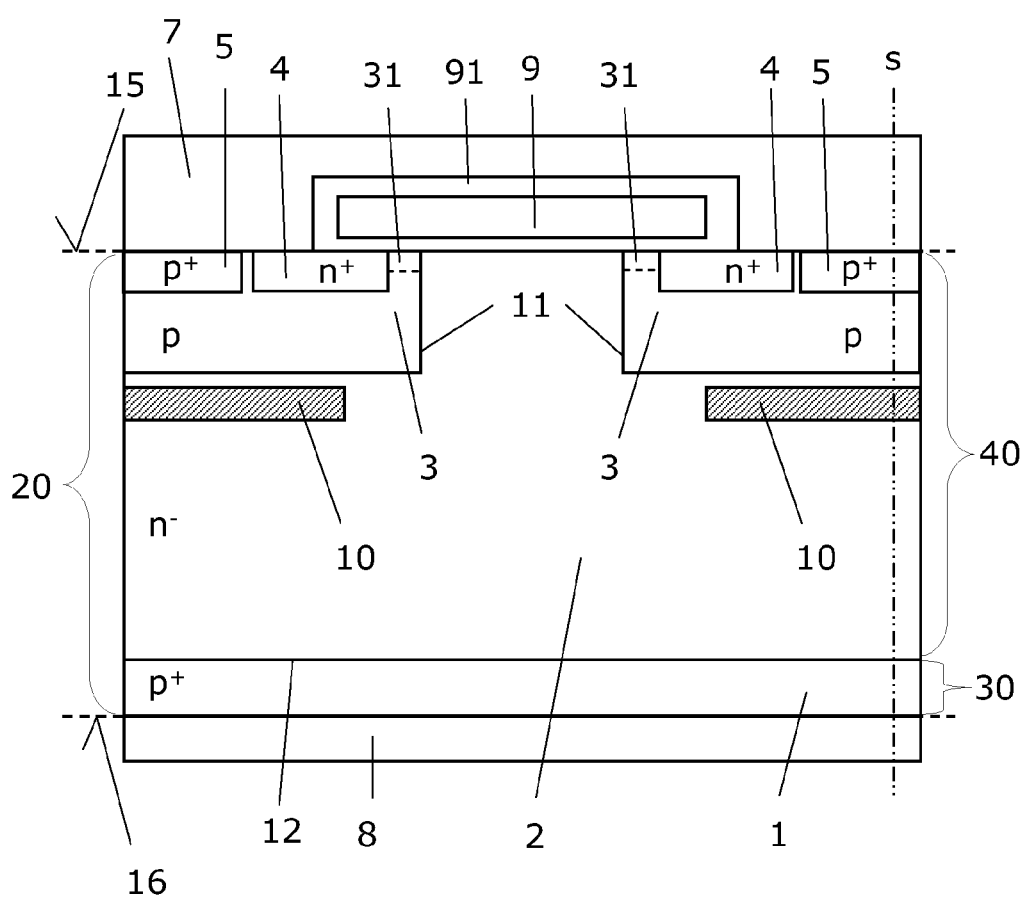
FIG. 2 illustrates, in a vertical cross-section, a semiconductor device according to one embodiment.

In another embodiment, the hole current redistributing structures 10 are arranged vertically below the respective body region 3. This is illustrated in FIG. 2 illustrating a similar semiconductor device 100 as FIG. 1 but with vertically deeper arranged hole current redistributing structures 10. In such an arrangement, the hole plasma concentration of the on-state may also be changed such that the trade-off between turn-off performance and VCEsat is improved. The hole current redistributing structures 10 are completely embedded within the drift region 2 in the semiconductor device 100 of FIG. 2. In FIG. 1 the hole current redistributing structures 10 are completely embedded within the respective body region 2. In other words, the hole current redistributing structures 10 are completely embedded within the semiconductor body 20. The hole current redistributing structures 10 or sub regions 10 are, therefore, in the following also referred to as embedded structures 10.

Figure 3:
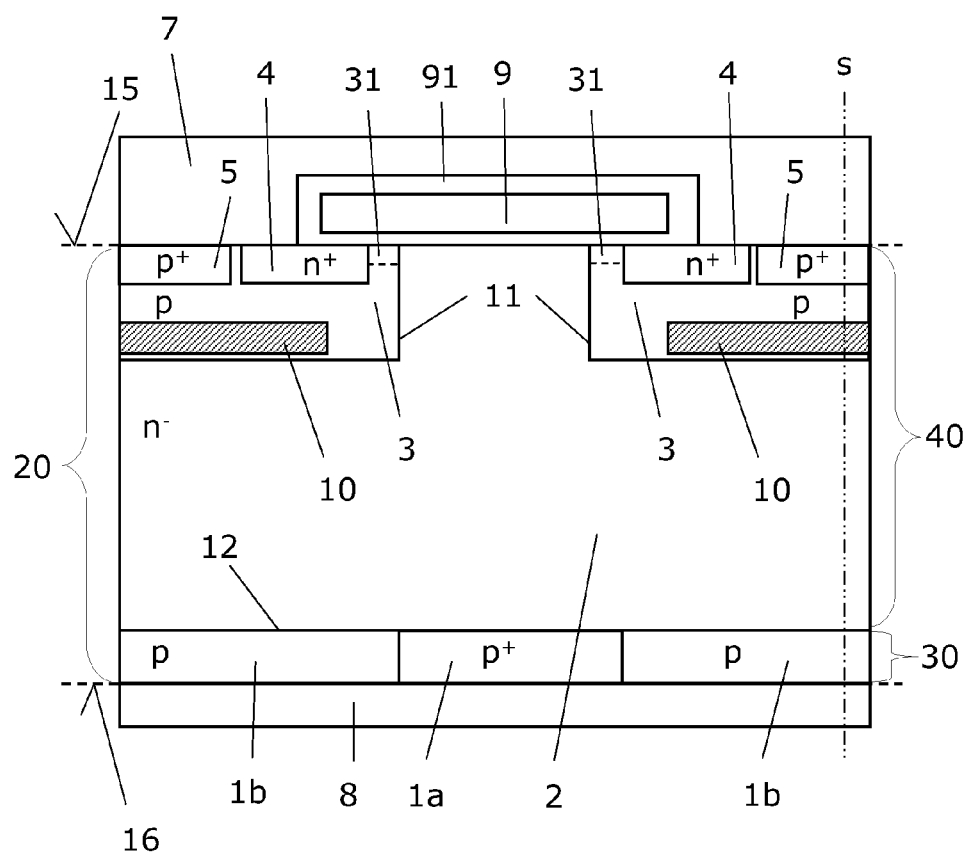
FIG. 3 illustrates a vertical cross-section of a semiconductor device according to one embodiment.

Referring now to FIG. 3, a further embodiment is explained. The semiconductor device 100 of FIG. 3 is similar to the semiconductor device 100 illustrated in FIG. 1 and it may also be operated as an IGBT. The semiconductor device 100 of FIG. 3 includes a horizontally structured collector region having a first collector portion 1a with a first doping concentration and two adjacent second collector portions 1b with a lower doping concentration than the first doping concentration. It is however also possible, that the doping concentration of the second collector portions 1b is higher than the first doping concentration. The minimum distance of the first collector portion 1a to the insulated gate electrode 9 is smaller than the minimum distance of the second collector portion 1b the insulated gate electrode 9. Due to the structured collector region of the IGBT 100 of FIG. 3, the gain μpnp of the pnp-transistor is horizontally varied. This may be used to improve the softness of the IGBT 100 during commutating. Note that IGBTs as illustrated in FIG. 1-3 may be considered as a Darlington configuration of an n-channel field effect transistor (FET) and a pnp-transistor.

The semiconductor devices 100 of FIGS. 1 to 3 may also be described as a planar IGBT 100, i.e., an IGBT 100 with an insulated gate electrode 9 arranged on the first surface 15. The planar IGBT 100 has in a vertical cross-section, an emitter electrode 7, a collector electrode 8 which is arranged below the emitter electrode 7, two p-type body regions 3, and an insulated gate electrode 9 which is arranged above the body regions 3. The planar IGBT 100 further includes two p-type body contact regions 5 each of which electrically connects a respective body region 3 with the emitter electrode 7, an n-type drift region 2 which forms respective pn-junctions 11 with the body regions 3, a p-type collector region 1 which is arranged on the collector electrode 8, an n-type drift region 2 which is arranged on the collector region 1, and two embedded structures 10. The two embedded structures 10 are arranged above the collector region 1 and selected from a group consisting of a porous semiconductor region, a cavity, an insulating region, and a semiconductor region including additional scattering centers for holes. Each of the embedded structures 10 is arranged below the respective body contact region 5 such that each of the two embedded structures overlaps, in a horizontal projection, at least partially with the respective body contact region 5.

Figure 4:
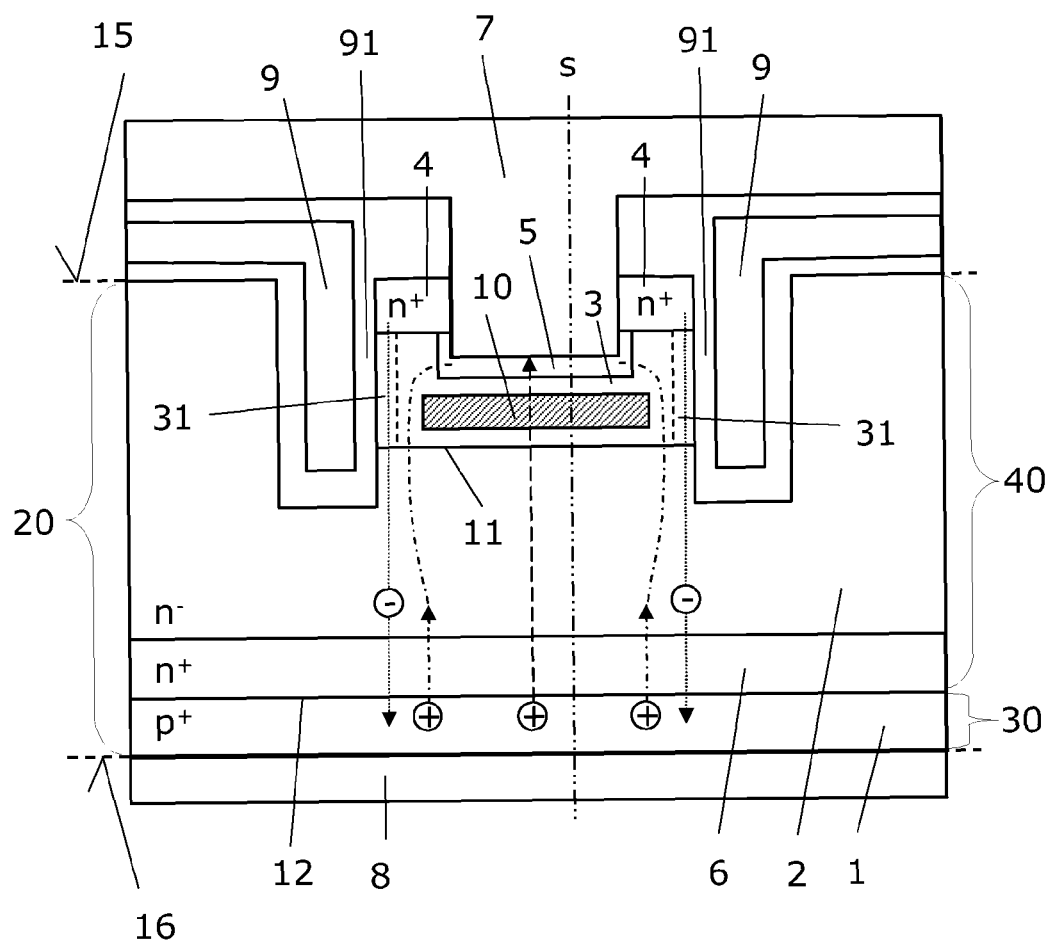
FIG. 4 illustrates, in a vertical cross-section, a semiconductor device according to one embodiment.
Figure 5:
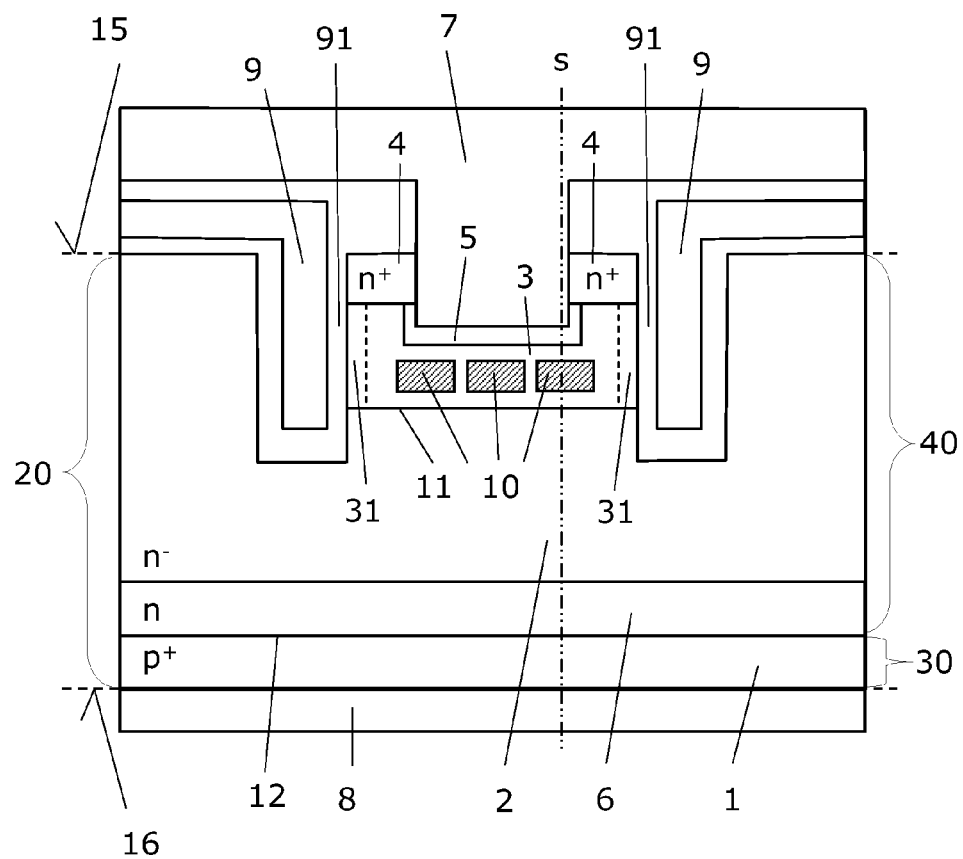
FIG. 5 illustrates a vertical cross-section of a semiconductor device according to one embodiment.
Figure 6:
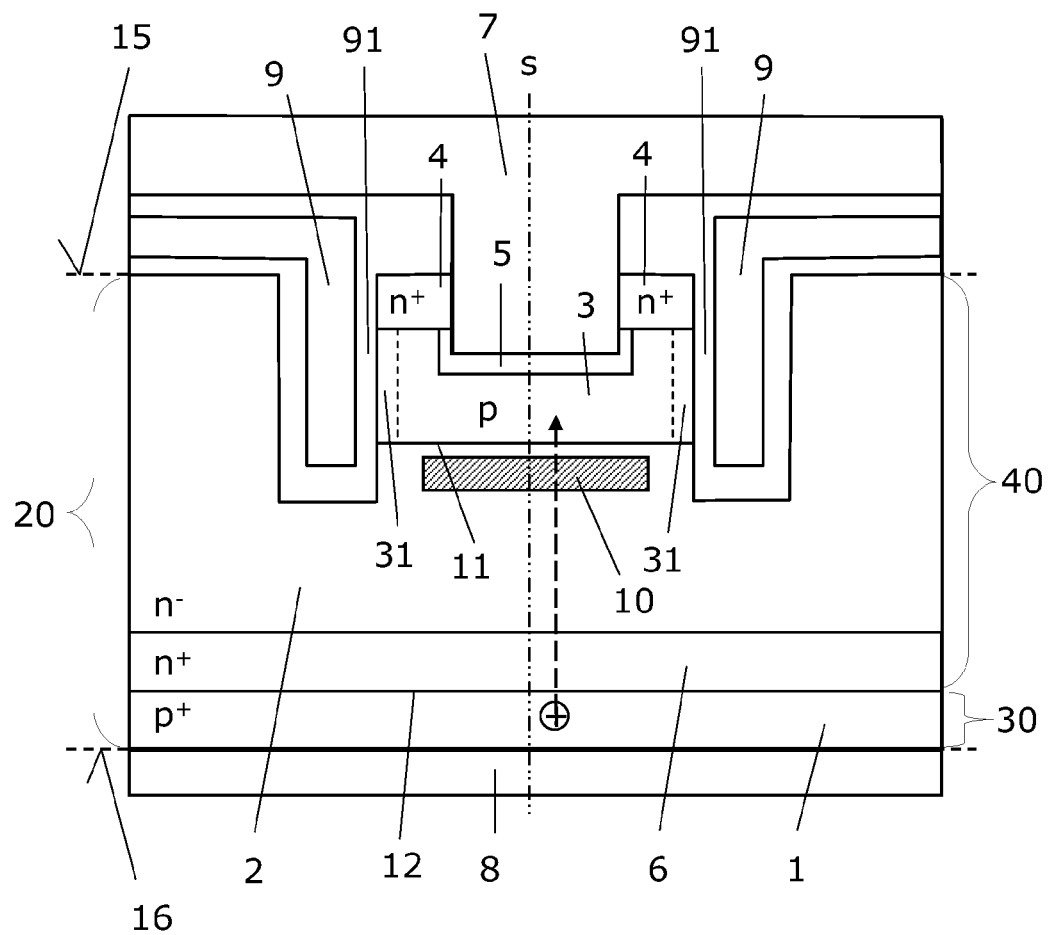
FIG. 6 illustrates a vertical cross-section of a semiconductor device according to one embodiment.

With respect to FIGS. 4 to 6 several embodiments of bipolar semiconductor devices with insulated gate electrodes arranged in a trench are explained.

The semiconductor device 100 of FIG. 4 is illustrated in a vertical cross-section. It includes an emitter electrode 7, a p-type body region 3, a n-type drift region 2 which forms a first pn-junction 11 with the body region 3, and two insulated gate electrodes 9 which are arranged in respective vertical trenches extending from a first surface 15 into the drift region 2. A p-type body contact region 5 is arranged between the two gate electrodes 9 and electrically connects the body region 3 with the emitter electrode 7. Below the drift region 2 a p-type collector region 1 is arranged in electric contact with a collector electrode 8.

The semiconductor device 100 of FIG. 4 may also be operated as an IGBT 100. Within the body region 3 an embedded structure 10 is arranged such that the embedded structure 10 and the body contact region 5 at least partially overlap in a horizontal projection. The embedded structure 10 may include or may be made of at least one of a porous semiconductor region, a cavity, an insulating region, and a semiconductor region with additional scattering centers for holes. In doing so, the hole plasma of the on-state may be redistribute such that the trade-off between turn-off performance and VCEsat in the on-state of the IGBT 100 is improved. This is illustrated by the dashed-dotted arrows indicating that the on-state hole current is concentrated to regions of high electron current (dotted arrows).

In the on-state, the electron current flows from an n-type source region 4 in electric contact with the emitter electrode 4, through channel regions 31 formed in the body region along the gate insulating region 91, through the drift region 2, an optional medium or highly doped n-type field-stop region 6, and to the collector region 1. The hole current along the geometrically shortest current lines between the collector electrode 8 and the emitter electrode 7 is typically also blocked or at least reduced as indicated by the dashed arrow in FIG. 4.

The second pn-junction 12 of the IGBT 100 is formed between the field-stop region 6 and the collector region 1. It goes without saying that the second pn-junction 12 may also be formed between the drift region 2 and the collector region 1 in other embodiments. Further, an n+ field stop region 6 may optionally also be arranged between the collector region 1 and the drift region 2 in planar IGBTs as illustrated in FIGS. 1 to 3. Furthermore, typical maximum doping concentrations are similar for planar and trench IGBTs. Maximum doping concentrations typically range between about $10^{16}$ cm$^{-3}$ and about several times $10^{17}$ cm$^3$ for the body regions 3, between about $5*10^{16}$ cm$^3$ and about $10^{20}$ cm$^{-3}$ for the (p+) body contact regions 5 and the collector region 1, between about $10^{12}$ cm$^{-3}$ and about $10^{14}$ cm$^{-3}$ for the (n−) drift region 2, between about three times $10^{19}$ cm$^{-3}$ and about a few times $10^{20}$ cm$^{-3}$ for the (n+) source regions 4 and between about $10^{15}$ cm$^{-3}$ and about $10^{17}$ cm$^{-3}$ for the field stop region 6. In addition, the material of the emitter electrode 7, the collector electrode 8 and the gate electrode 9 is typically a metal such as Al, Ti, W and Cu or a combination of layers including at least one of these metals or alloys of them but may also be a material with metallic or near metallic properties with respect to electric conductivity such as heavily doped n-type or p-type poly-Si, TiN or an electrically conductive silicide such as $WSi_2$.

With respect to FIG. 5 a further embodiment will be explained. The semiconductor device 100 of FIG. 5 is similar to the semiconductor device of FIG. 4. However, the body region 3 encloses several sub regions 10 or hole current redistributing structures 10 to redistribute the hole plasma in the on-state of the IGBT 100. It goes without saying that several sub regions 10 or hole current redistributing structures 10 per body region 3 may also be used to redistribute the hole plasma in the on-state of planar IGBTs 100 as described with reference to FIGS. 1 to 3.

With respect to FIG. 6 still a further embodiment will be explained. The semiconductor device 100 of FIG. 5 is similar to the semiconductor device of FIG. 4. However, the hole current redistributing structures 10 is also arranged above the collector region 1 but not embedded within the body region 3 but within the drift region 2 to redistribute the hole plasma in the on-state of the IGBT 100. For this purpose, the embedded structure 10 of the semiconductor device of FIG. 6 may include or may be made of at least one of a porous semiconductor region, a cavity, and a semiconductor region with additional scattering centers for holes.

Figure 7:
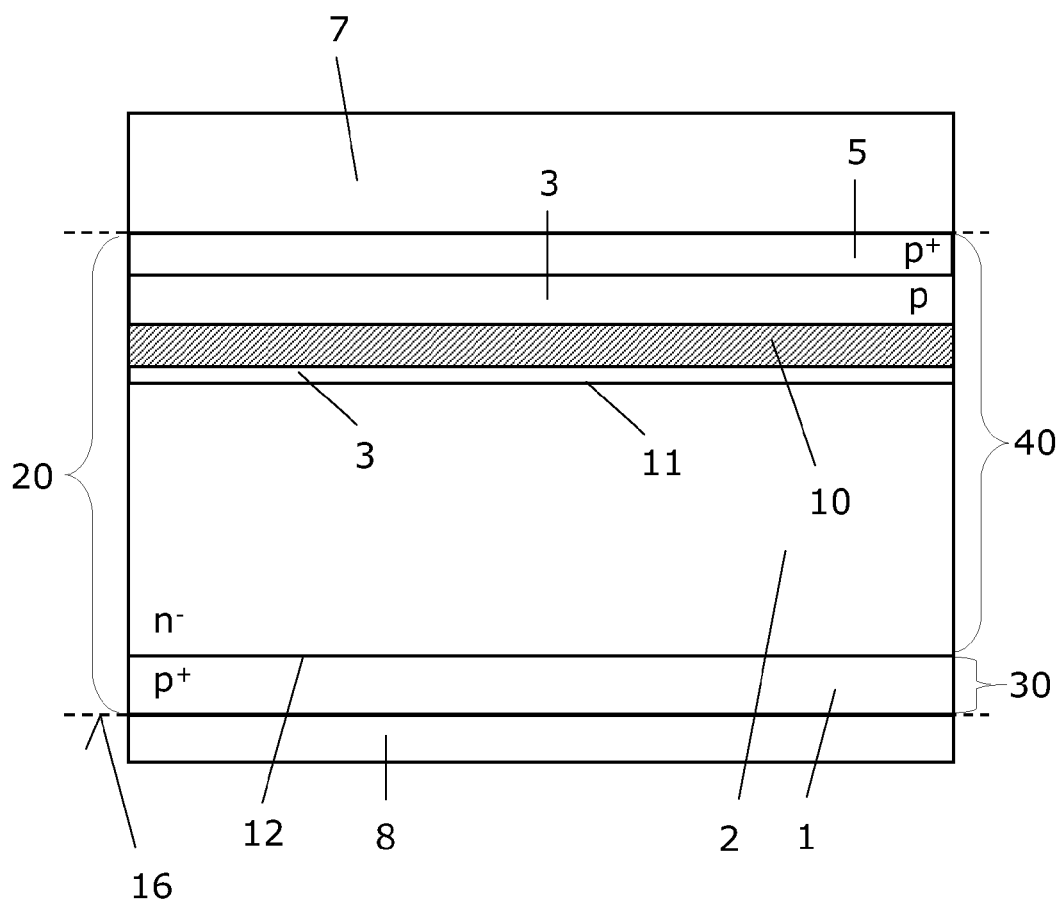
FIG. 7 illustrates a further vertical cross-section of the semiconductor device illustrated in FIG. 1 according to one embodiment.

The common feature of the semiconductor devices 100 illustrated in FIGS. 1 to 6 may also be described as an IGBT with an emitter electrode 7 arranged on a main horizontal surface 15 of a semiconductor body 20 which has a body contact region 5 electrically connected to the emitter electrode 7 and an embedded structure 10 of lower hole mobility than adjacent semiconductor regions. The embedded structure 10 is arranged vertically below the body contact region 5, and the body contact region 5 and the embedded structure 10 are arranged in two vertical cross-sections which are orthogonal to each other and to the first surface 15. This is further illustrated in FIG. 7 illustrating the semiconductor device 100 of FIG. 1 in a further vertical cross-section along the line s in FIG. 1. The cross-sections of FIGS. 1 and 7 are orthogonal to each other and the main surface 15. Both vertical cross-sections include the body contact regions 5 and the embedded structures 10. This is also true for the semiconductor devices 100 of FIGS. 2 to 6 and their respective further vertical cross-section along the respective lines s. FIG. 7 shows a simply connected continuous embedded structure 10. It is however also possible, that the further vertical cross-section along the line s in FIGS. 1 to 6 shows several horizontally spaced apart embedded structures 10.

Typically, the semiconductor devices 100 illustrated in FIGS. 1 to 6 are power semiconductor devices having a plurality of structures illustrated in the Figures. In other words, the illustrated sections typically correspond to a unit cell of such a power semiconductor device. Further, regions that are separated from each other in a vertical cross-section may also be simply connected. This is typically not the case when the illustrated regions are shaped as bars which extend out of the drawing planes. The body region 3, the embedded region 10 as well the body contact region 5 and the source region 4 in FIG. 1 or the source region 4 in FIGS. 4 to 6 may also be ring shaped, i.e., simply connected. In these events, a vertical cross-section will show separated respective portions.

In the following, methods for forming the semiconductor devices explained above are described.

With respect to FIGS. 8 to 12 a method for forming a semiconductor device 100 according to several embodiments is illustrated. In a first process a silicon semiconductor substrate 20a is provided. As illustrated in the vertical cross-section of FIG. 8, the semiconductor substrate 15 includes a main horizontal surface 15a and an opposite arranged surface 16, a typically weakly doped n-type first semiconductor region 2, a typically highly doped p-type second semiconductor region 1 and a substantially horizontally orientated pn-junction 12 formed between the first and the second semiconductor region 2, 1. In the finally formed device the second semiconductor region 1 typically forms a collector region 1 and at least parts of the first semiconductor region 2 form parts of a drift region 2. It is however also possible, that a medium or highly doped n-type layer is arranged between the first semiconductor region 2 and the second semiconductor region 1. The medium or highly doped n-type layer typically forms a field-stop region in the finally formed semiconductor device. Typically, the optional medium or highly doped n-type layer and the first semiconductor region 2 are formed by epitaxial deposition. During epitaxial deposition, the desired doping concentration of the first semiconductor region 2 and the medium or highly doped n-type layer can be adjusted by supplying an appropriate amount of dopant. The optional medium or highly doped n-type layer and the second semiconductor region 1 may also be formed by implantation at the second or opposite surface 16 and a subsequent drive-in process.

Figure 9:
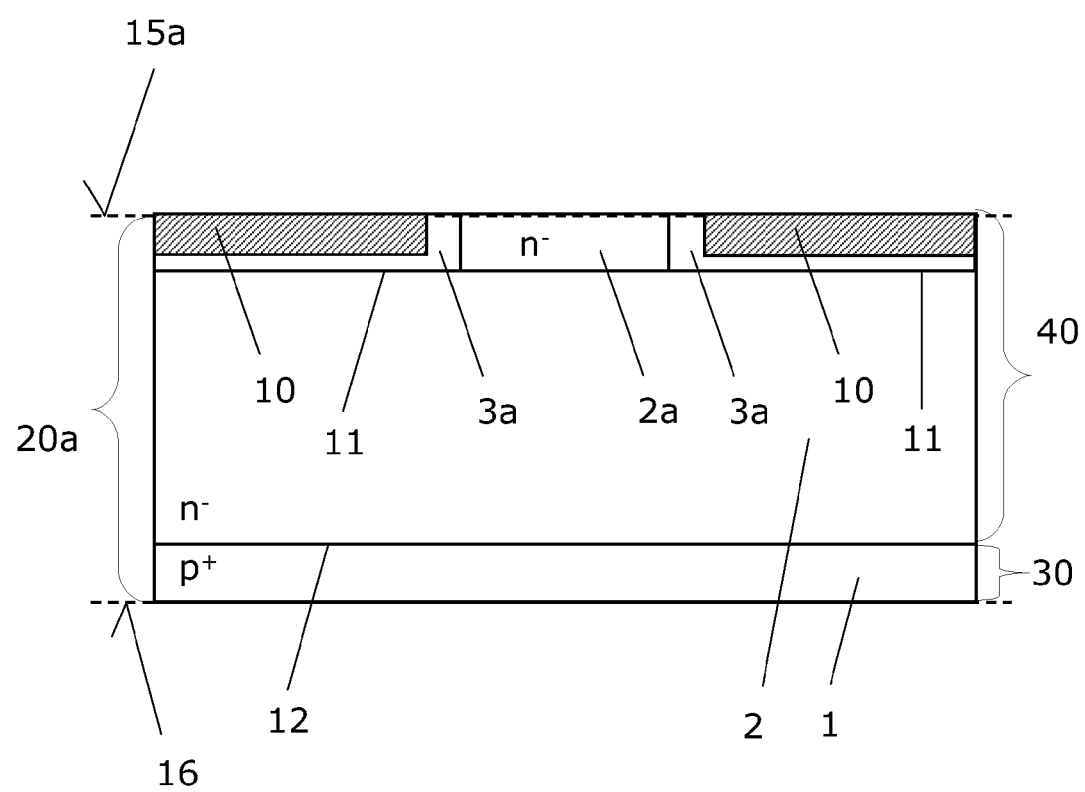

Thereafter, p-type regions 3a are formed e.g. by a masked implantation of boron at the first surface 15a and a subsequent drive-in process. The p-type regions 3a are horizontally spaced apart by a portion 2a of the first semiconductor region 2 which was masked during implantation. Further, the p-type regions 3a form with the first semiconductor region 2 further pn-junctions 11. Thereafter, a sub region 10 is formed in each of the regions 3a, e.g. by a doping process, such that their hole mobility is smaller than the hole mobility of the regions 3a. According to one embodiment, the doping can be performed by an in-diffusion process of a donor such as phosphorous or selenium into the sub regions 10. The final concentration of donors should be lower than their compensation concentration to avoid forming of additional pn-junctions. The resulting structure is illustrated in FIG. 9.

In one embodiment, the sub regions 10 are formed by masked ion implanting of e.g. Si or Ar ions and a subsequent thermal annealing. Thermal annealing is typically carried out at temperatures between about 800° C. and about 1200° C. In doing so, only electrically inactive defects remain in the crystal, defects which result in electron-hole recombination are cleared away or almost cleared away. The remaining electrically inactive defects are efficient in reducing the hole mobility. Using protons during implantation additionally results in lowering the effective level of p-doping in the sub regions 10.

In one embodiment, the sub regions 10 are formed as dielectric regions, e.g. by thermal oxidation.

The sub regions 10 may also be formed by masked anodizing the semiconductor substrate at the first surface 15a to form porous semiconductor regions 10. This can e.g. be achieved by dipping in HF solutions which may include some alcohols like isopropylalcohol or ethanol. To form larger cavities 10, a thermal rearranging of the porous semiconductor region 10 may subsequently be used.

Figure 10:
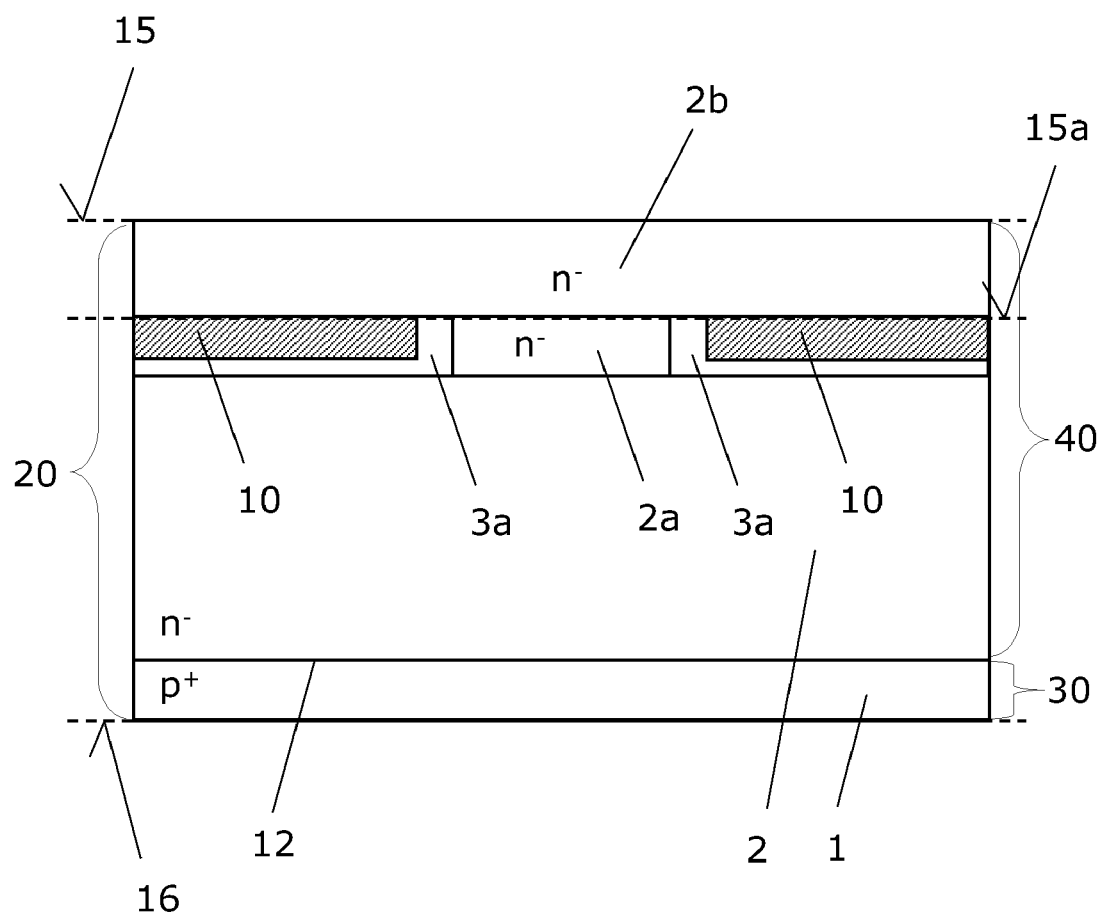

Thereafter, an n⁻ type epitaxial layer 2b is deposited, e.g. from trichlorosilane (SiHCl₃) at a temperature of about 1200° C. In doing so, a new main horizontal surface 15 of the semiconductor device 100 is formed above the surface 15a. The resulting structure is illustrated in FIG. 10.

If desired, the manufacturing can include separate epitaxial deposition, ion implantation and annealing processes with different dopants of varying concentration or with the same dopant but with varying concentration to form the respective functional regions.

Typically, a H₂ annealing process is carried out between forming porous sub regions 10 and depositing the epitaxial layer 2b on the main surface 15a.

Figure 11:
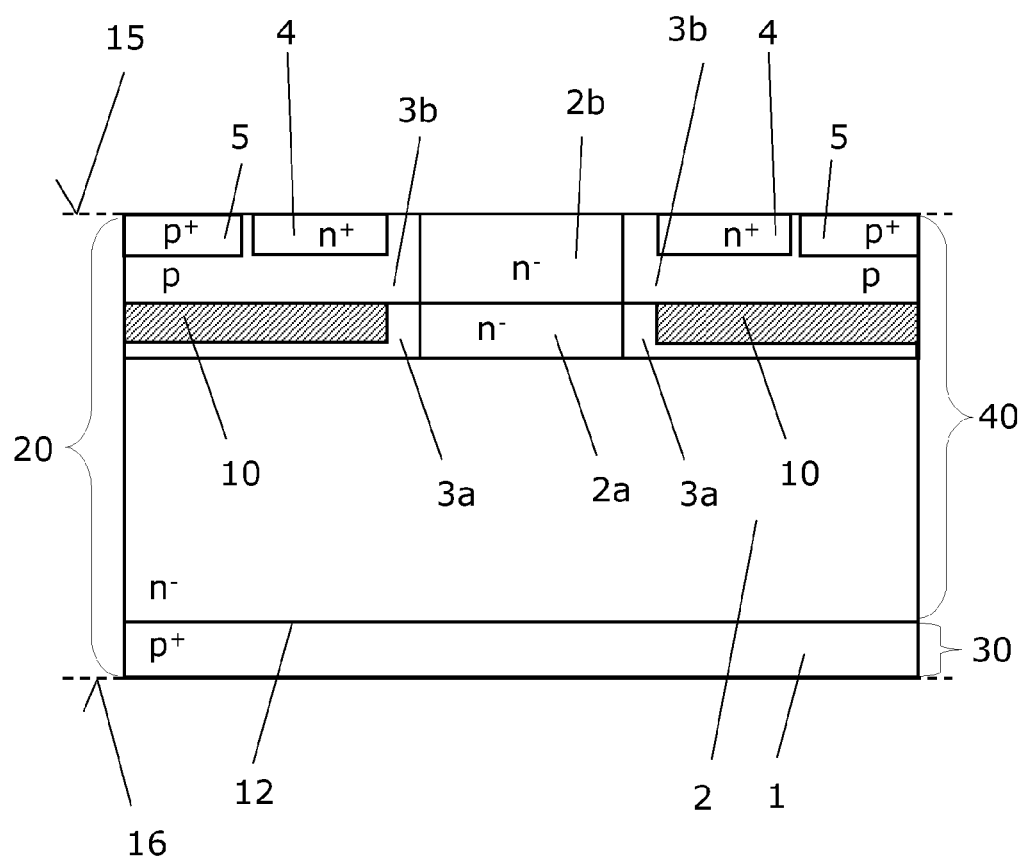

Thereafter, the upper portions 3b of the body regions are formed. Further, a fourth p⁺-type semiconductor region 5 or body contact region 5 and an n⁺-type source region 4 are formed in each upper portion 3b. In doing so, each sub region 10 is completely embedded within the respective p-type body region 3, i.e., the sub regions 10 form embedded structure 10. The resulting structure 100 is illustrated in FIG. 11.

The body contact regions 5 and the embedded structures 10 are typically formed such that a body contact region and a respective embedded structure 10 are arranged in two vertical cross-sections which are orthogonal to each other and to the main surface 15 and 15a, respectively.

Figure 12:
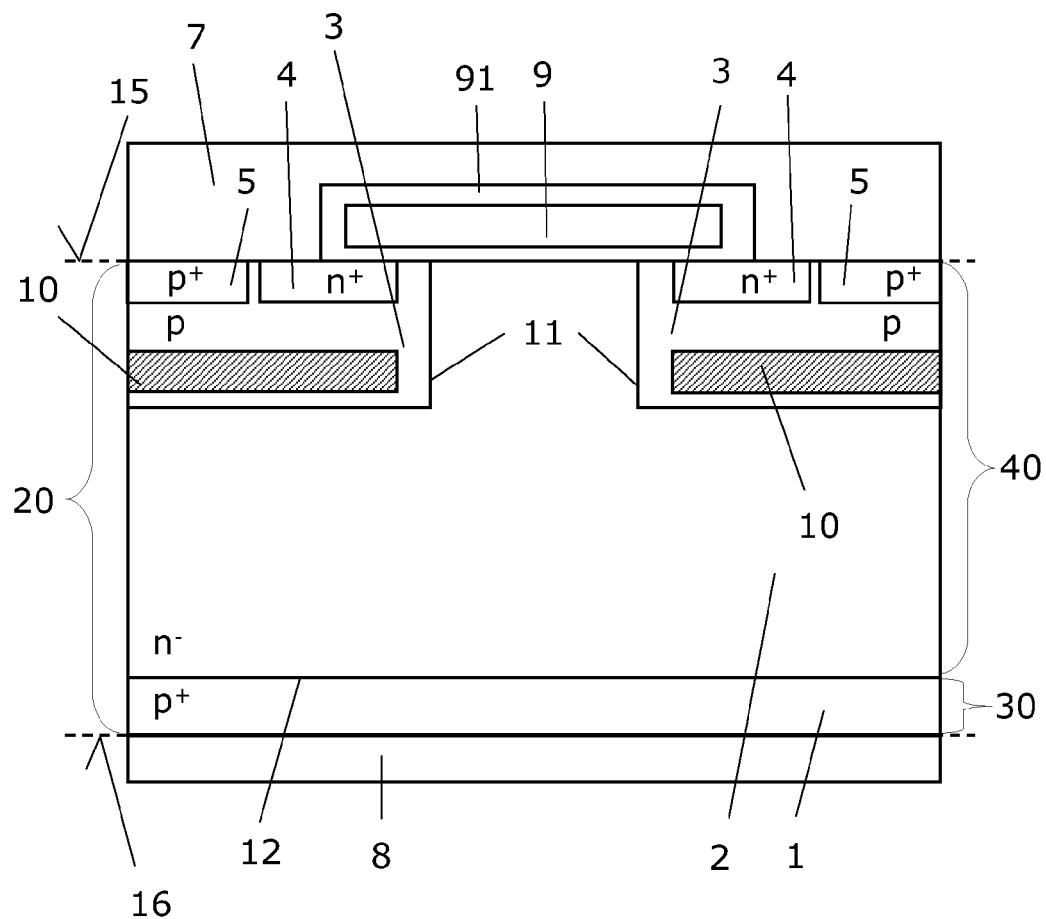

Thereafter, a planar gate electrode is typically formed on the first surface 15, i.e., next to the further pn-junction 11. Further, a first metallization 7 or emitter electrode 7 and a second metallization 8 or collector electrode 8 are formed on the first surface 15 and the opposite surface 16, respectively. The resulting semiconductor structure 100 is illustrated in FIG. 12 and may also be operated as an IGBT 100 with the first semiconductor region 2, the portions 2a and 2b forming a common drift region 2, and adjoining lower and upper portions 3a and 3b forming a respective body region 3 and having a further pn-junction 11 with the common drift region 2.

In one embodiment, the sub regions 10 are formed by masked ion implanting of e.g. Si, H, He, Ar, B ions and a subsequent thermal annealing after forming or shortly before forming the emitter electrode 7. In this embodiment, the thermal annealing is typically carried out at temperatures between about 200° C. and about 500° C., more typically in a temperature range between about 400° C. and about 500° C. In doing so, only electrically inactive defects remain in the crystal, defects which result in electron-hole recombination are cleared away or almost cleared away. The remaining electrically inactive defects are efficient in reducing the hole mobility. Using protons during implantation additionally results in lowering the effective level of p-doping in the sub regions 10.

Figure 8:
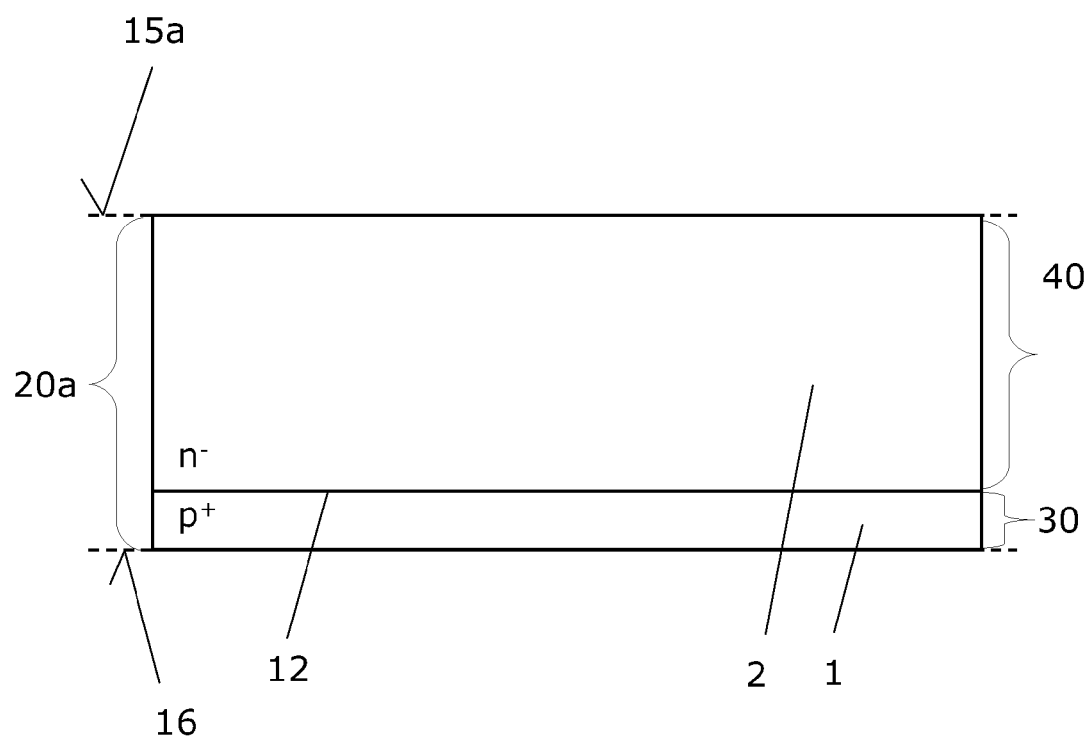
FIGS. 8-12 illustrate, in a vertical cross-section, manufacturing processes according to one or more embodiments.
Figure 13:
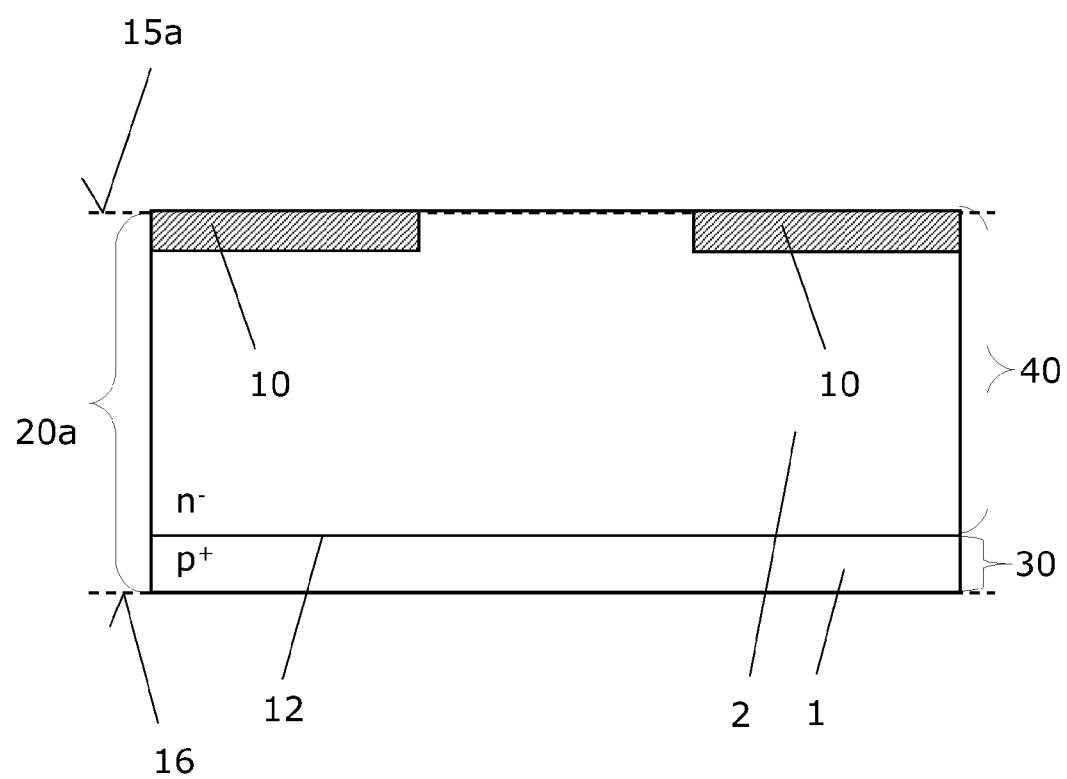
FIGS. 13-14 illustrates, in a vertical cross-section, manufacturing processes according to one or more embodiments.
Figure 14:
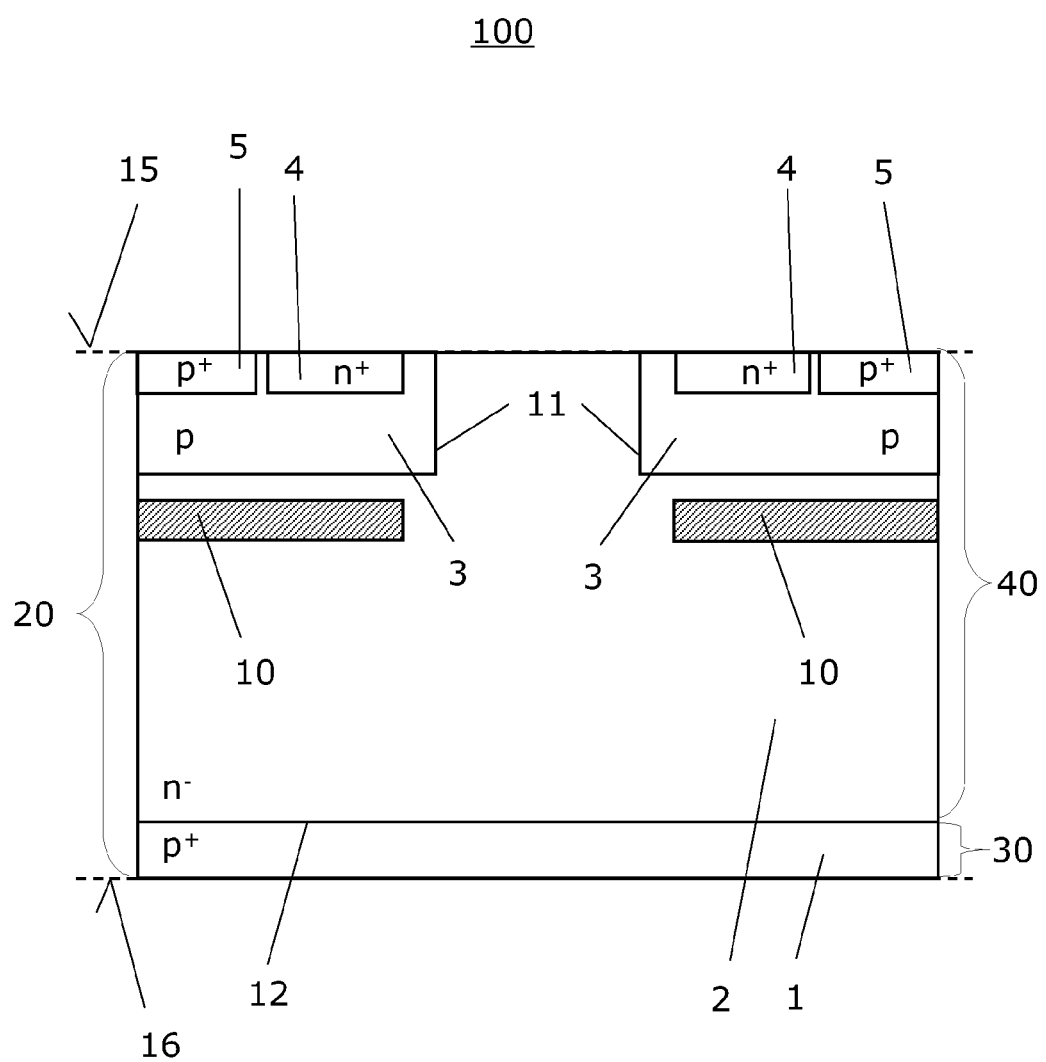

With respect to FIGS. 13 and 14 a further method for forming a semiconductor device 100 according to several embodiments is illustrated. Firstly, a semiconductor 100 as explained with reference to FIG. 8 is provided. Thereafter, horizontally spaced apart sub regions 10 of at least low hole conductivity are formed from the first surface 15a using any of the methods explained with reference to FIG. 9. The resulting structure 100 is illustrated in a cross-sectional view in FIG. 13.

Thereafter, an n⁻ type epitaxial layer 2b is deposited on the first surface 15a as explained with reference to FIG. 10 and two spaced apart body regions 3, a body contact region 5 and a source region 4 adjoining each body region 3 are formed e.g. by masked ion implantation and subsequent drive-in. The resulting structure 100 is illustrated in FIG. 14 and similar to the structure of FIG. 11 but with embedded structures 10 of lower hole mobility than the embedding drift region 2. This structure 100 may also be operated as an IGBT after further forming of the insulated gate electrode, the emitter electrode 7 and the collector electrode 8 as explained with reference to FIG. 12.

Figure 15:
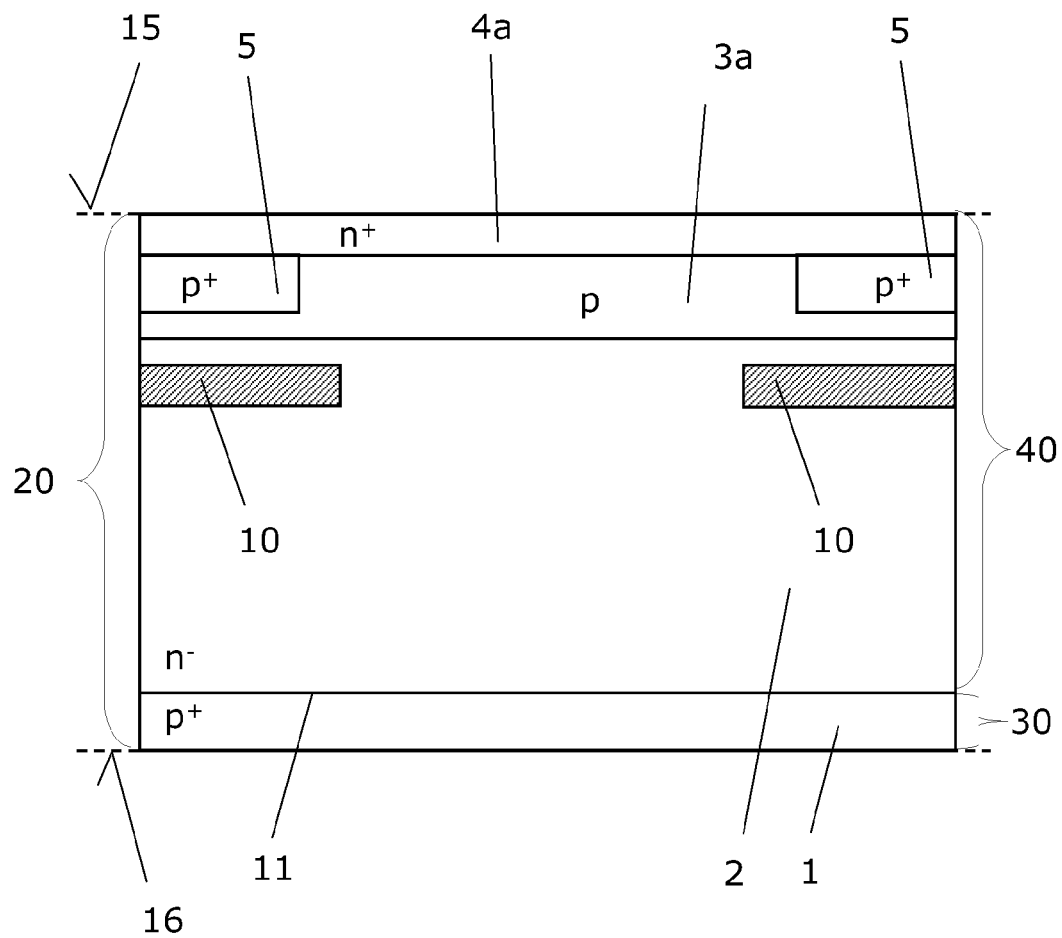
FIGS. 15-17 illustrates, in a vertical cross-section, manufacturing processes according to one or more embodiments.
Figure 16:
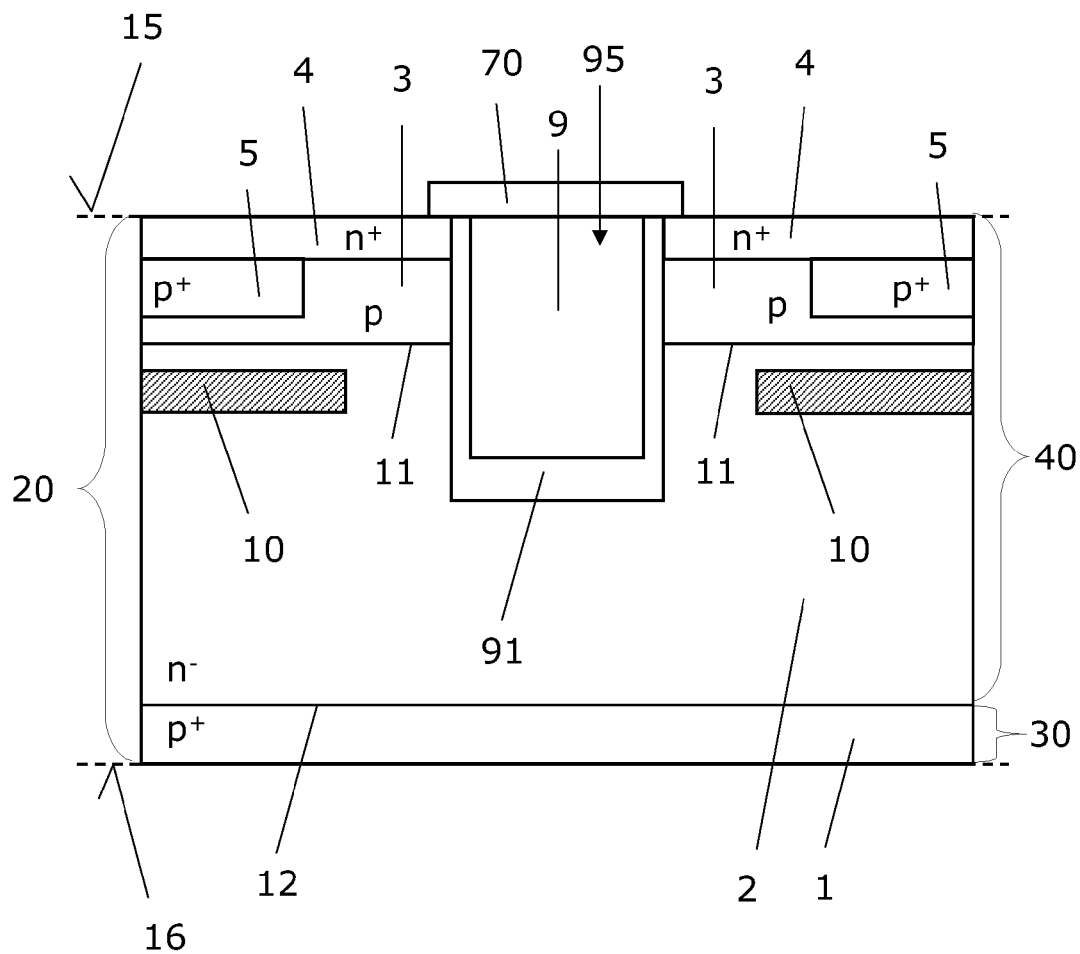
Figure 17:
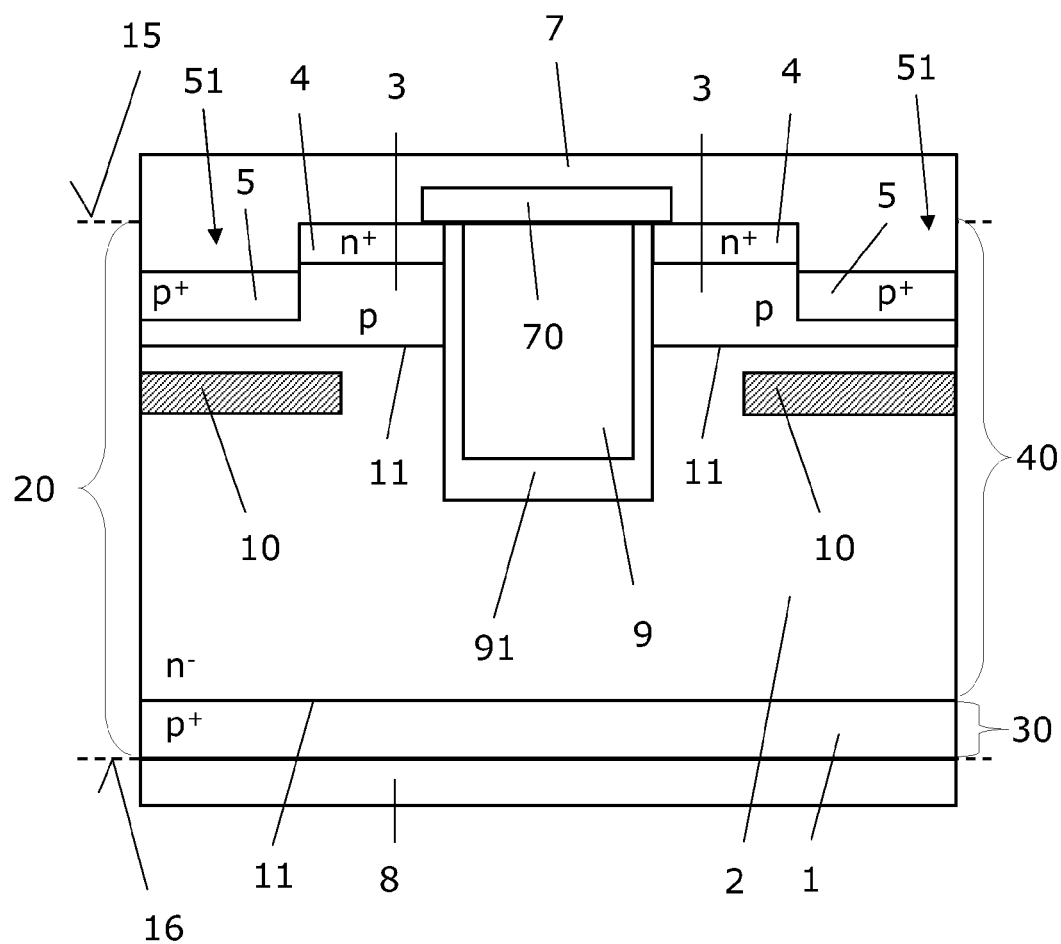

With respect to FIGS. 15 to 17 a method for forming a semiconductor device 100 with a trench gate electrode according to several embodiments is illustrated. The first processes are similar to the processes which result in the semiconductor device 100 of FIG. 13. Thereafter, an n-type layer is epitaxially deposited on the first surface 15a. This is followed by forming a p-type semiconductor layer 3a either epitaxially on the n-type layer or by unmasked ion implantation. Thereafter, two p⁺ type body contact regions 5 are formed within the layer 3 such that the embedded structures 10 and the respective body contact regions 5 at least partially overlap in a horizontal projection.

Afterwards, a further n⁺ type layer 4a is formed either epitaxially on the p-type layer 3a or by unmasked ion implantation. The resulting structure 100 is illustrated in FIG. 15.

Thereafter, a trench is etched between the embedded structures 10 from the first surface 15, through the n+ type layer 4a, the p-type layer 4a into the drift region 2. In doing so, separated body regions 3 and source regions 4 are formed. Further, a gate oxide 91 is formed on the side walls of the trench 95 and the trench is filled with a conducting material 9, e.g. by depositing of highly doped poly-Si and back etching. The resulting structure 100 is illustrated in a vertical cross-section in FIG. 16 after further forming a dielectric portion 70 on the first trench 95. In doing so, a trench gate electrode 9 is formed next to the further pn-junction 11. Instead of forming the source regions 4 by unmasked ion implantation and etching a trench, the n⁺ type source regions 4 may also be formed by a masked ion implantation of donors and a subsequent annealing step.

Thereafter, contact trenches 51 are etched from the first surface 15, through each source region 5 and at least partially into the respective body contact region 5 and an emitter metallization 7 is deposited on the first surface 15. The resulting structure 100, which may be operated as a trench IGBT, is illustrated after further forming a collector metallization 8 on the opposite surface 16 in FIG. 17.

Typically, the illustrated vertical cross-section of FIGS. 9 to 17 represents only a section, e.g. a unit cell of the semiconductor device 100.

In the above explained embodiments of manufacturing a semiconductor device 100, a silicon semiconductor substrate 20, 20a already having an substantially horizontally orientated pn-junction 12 is provided in a first process. It is however also possible to provide a substrate wafer 20 or die 20 having the desired background doping concentration of the drift region 2 in the first process. Regions of reduced hole mobility 10, body regions 3, source regions 4 and body conduct regions 5 are formed as has been explained above. Thereafter, the substrate wafer 20 may be thinned at the second surface 16 and a collector region 1 is typically formed by implantation at the second surface 16. By using this approach, the number of expensive epitaxial deposition steps can be reduced.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench IGBT, comprising in a vertical cross-section:
   an emitter electrode;
   a p-type body region;
   an n-type drift region forming a pn-junction with the body region;
   an insulated gate electrode arranged in a vertical trench extending through the p-type body region into the drift region;
   a p-type body contact region electrically connecting the body region with the emitter electrode,
   a p-type collector region arranged below the drift region; and
   an embedded structure arranged above the collector region and selected from a group consisting of a porous semiconductor region, a cavity, and a semiconductor region comprising additional scattering centers for holes,
   the embedded structure being arranged below the body contact region such that the embedded structure and the body contact region overlap in a horizontal projection.

2. The trench IGBT according to claim 1, wherein the embedded structure is at least partially arranged in the drift region.

3. The trench IGBT according to claim 1, wherein the embedded structure is at least partially arranged the body region.

4. The trench IGBT according to claim 1, wherein the body region comprises a channel region and wherein the embedded structure and the channel region are non-overlapping in a horizontal projection.

* * * * *